(12) United States Patent
Yang et al.

(10) Patent No.: US 10,878,746 B2
(45) Date of Patent: *Dec. 29, 2020

(54) ORGANIC LIGHT EMITTING DISPLAY DEVICE AND DRIVING METHOD THEREOF

(71) Applicant: Samsung Display Co., Ltd., Yongin-si (KR)

(72) Inventors: Ji-Yeon Yang, Yongin-si (KR); Geun-Young Jeong, Yongin-si (KR); Takeshi Kato, Yongin-si (KR); Myung-Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/207,023

(22) Filed: Nov. 30, 2018

(65) Prior Publication Data

US 2019/0103053 A1  Apr. 4, 2019

Related U.S. Application Data

(63) Continuation of application No. 13/752,154, filed on Jan. 28, 2013, now Pat. No. 10,147,351.

(30) Foreign Application Priority Data

Sep. 12, 2012  (KR) .................. 10-2012-0100881

(51) Int. Cl.
  *G09G 3/3208*  (2016.01)
  *G09G 3/20*  (2006.01)
(52) U.S. Cl.
  CPC ............. *G09G 3/3208* (2013.01); *G09G 3/20* (2013.01); *G09G 2300/0452* (2013.01);
  (Continued)

(58) Field of Classification Search
  CPC ................... G09G 3/3208; G09G 2320/0276
  See application file for complete search history.

(56) References Cited

U.S. PATENT DOCUMENTS 7,123,277 B2  10/2006  Brown et al.
7,525,526 B2  4/2009  Elliott et al.
(Continued)

FOREIGN PATENT DOCUMENTS

CN  101551566 A  10/2009
KR  10-2004-0080442 A  9/2004
(Continued)

OTHER PUBLICATIONS

Chinese Office Action dated Dec. 2, 2016 for Chinese Patent Application No. CN 201310181186.0, which cites the above-identified references numbered 1-2, and which shares priority of Korean Patent Application No. KR 10-2012-0100881 with subject U.S. Appl. No. 13/752,154.

(Continued)

*Primary Examiner* — Kent W Chang
*Assistant Examiner* — Chayce R Bibbee
(74) *Attorney, Agent, or Firm* — Lewis Roca Rothgerber Christie LLP (57) ABSTRACT

An organic light emitting display device and a driving method thereof are disclosed. The display device has sub-pixels of multiple colors. In one aspect, the organic light emitting display device detects sub-pixels which are positioned at the edges of the panel. Data for the sub-pixels on the edges are reduced so that colors on the edges are less observable.

12 Claims, 5 Drawing Sheets

(52) U.S. Cl.
CPC ............... *G09G 2300/0465* (2013.01); *G09G 2310/0232* (2013.01); *G09G 2320/0242* (2013.01)

(56) References Cited

U.S. PATENT DOCUMENTS

| | | |
|---|---|---|
| 7,755,652 B2 | 7/2010 | Credelle et al. |
| 8,519,910 B2 | 8/2013 | Park et al. |
| 2005/0078104 A1 | 4/2005 | Matthies et al. |
| 2007/0035557 A1 | 2/2007 | Choe et al. |
| 2009/0141045 A1 | 6/2009 | Jackson |
| 2010/0091030 A1 | 4/2010 | Park et al. |
| 2010/0149204 A1 | 6/2010 | Han |
| 2011/0260951 A1* | 10/2011 | Hwang ............ G02F 1/134336 345/55 |
| 2011/0267376 A1 | 11/2011 | Park |
| 2012/0026216 A1* | 2/2012 | Brown Elliott .......... G09G 3/20 345/694 |
| 2012/0119980 A1 | 5/2012 | Joffer et al. |
| 2012/0162156 A1 | 6/2012 | Chen et al. |

FOREIGN PATENT DOCUMENTS

| | | |
|---|---|---|
| KR | 10-0888983 B1 | 3/2009 |
| KR | 10-2009-0068591 A | 6/2009 |
| KR | 10-2009-0122307 A | 11/2009 |
| KR | 10-0926635 B1 | 11/2009 |
| KR | 10-2010-0041583 A | 4/2010 |
| KR | 10-2011-0046544 A | 5/2011 |
| KR | 10-2011-0121891 A | 11/2011 |
| KR | 10-2011-0131540 A | 12/2011 |
| KR | 10-1332495 B1 | 11/2013 |
| KR | 10-1894326 B1 | 10/2018 |

OTHER PUBLICATIONS

Taiwan Office Action dated Sep. 5, 2016 for Taiwan Patent Application No. TW 102110843 which shares priority of Korean Patent Application No. KR 10-2012-0100881 with subject U.S. Appl. No. 13/752,154, and cites the above-identified references numbered 1-2.
Extended European Search Report dated Sep. 5, 2013 for European Patent Application No. EP 13 167 352.7 which shares priority of Korean Patent Application No. KR 10-2012-0100881 with captioned U.S. Appl. No. 13/752,154, and cites the above-identified references.

* cited by examiner

ORGANIC LIGHT EMITTING DISPLAY
DEVICE AND DRIVING METHOD THEREOF

CROSS-REFERENCE TO RELATED APPLICATIONS

This application is a continuation of U.S. patent application Ser. No. 13/752,154, filed Jan. 28, 2013, which claims priority to and the benefit of Korean Patent Application No. 10-2012-0100881, filed Sep. 12, 2012, the entire content of both of which is incorporated herein by reference.

BACKGROUND

Field

The disclosed technology relates to an organic light emitting display device and a driving method thereof, and more particularly, to an organic light emitting display device and a driving method thereof having high image quality.

Description of the Related Technology

An organic light emitting display (OLED) device is used to display an image using organic light emitting diodes that are self-luminescent elements. Such a display device is widely used as a next-generation display device because of its excellent luminance and color purity.

In display devices, pixels include red sub-pixels, green sub-pixels and blue sub-pixels, and accordingly, various color images are displayed.

The red sub-pixels, the green sub-pixels and the blue sub-pixels may be arranged in various configurations. The red sub-pixels, the green sub-pixels and the blue sub-pixels are generally arranged linearly, for example, such that sub-pixels of the same color are arranged in a column.

If the sub-pixels are linearly arranged, an aperture ratio is reduced by black non-emitting structure positioned between the respective sub-pixels, and the ability to display a high-resolution image is degraded.

To solve such a problem, "ClairVoyante Laboratories Inc." has proposed a pixel arrangement structure, entitled as "The Pentile Matrix Color Pixel Arrangement." In the Pentile matrix color pixel arrangement, red and blue sub-pixels are alternately formed on the same column, and green sub-pixels are formed on an adjacent column. Furthermore, color pixel arrangement, the number of sub-pixels is decreased to approximately ⅔ of that in the linear arrangement, a high aperture ratio is achieved. Such an arrangement may be applied in an OLED display device to display a high-resolution image and to improve image quality by using a structure in which does use the linear arrangement. However, in the Pentile arrangement, green and red colors are seen as lines (greenish and pinkish) at edges of the OLED display device.

SUMMARY OF CERTAIN INVENTIVE ASPECTS

One inventive aspect is an organic light emitting display device. The display device includes a pixel unit having a plurality of sub-pixels, a scan driver configured to drive scan lines coupled to the sub-pixels, a data driver configured to drive data lines coupled to the sub-pixels and positioned in a direction intersecting the scan lines, and a data processor configured to receive a first data and to generate a second data based on the first data. The data processor generates the second data by changing grayscale values of the first data for sub-pixels positioned at edges of the pixel unit.

Another inventive aspect is a method of driving an organic light emitting display device. The method includes sensing a sub-pixel color arrangement of a display panel, and generating second data by changing grayscale values of first data to be supplied to sub-pixels positioned at edges of the panel, according to the sub-pixel color arrangement.

BRIEF DESCRIPTION OF THE DRAWINGS

The accompanying drawings, together with the specification, illustrate exemplary embodiments, and, together with the description, serve to explain certain inventive features, aspects, and principles.

DETAILED DESCRIPTION OF CERTAIN INVENTIVE EMBODIMENTS

Hereinafter, certain exemplary embodiments are described with reference to the accompanying drawings. Here, when a first element is described as being coupled to a second element, the first element may be directly coupled to the second element or may be indirectly coupled to the second element via a third element. Further, some of the elements that are not essential to the complete understanding are omitted for clarity. Also, like reference numerals generally refer to like elements throughout.

Figure 1:
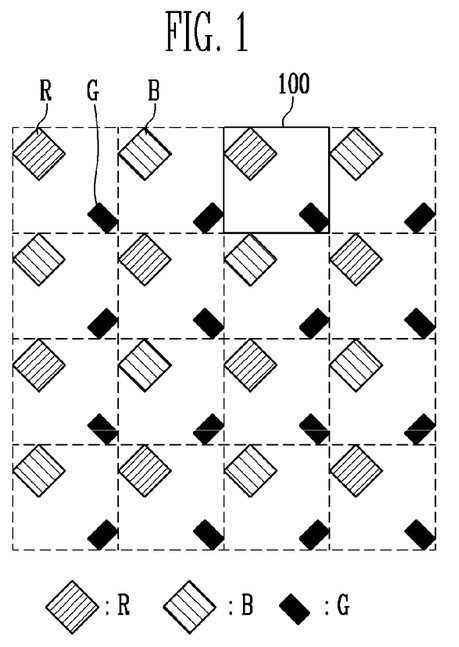
FIG. 1 is a view illustrating a pixel arrangement structure of an organic light emitting display device according to an embodiment.

FIG. 1 is a view illustrating a pixel arrangement structure of an organic light emitting display device according to an embodiment. Referring to FIG. 1, in the organic light emitting display device according to this embodiment, red and blue sub-pixels R and B are repetitively arranged on a particular column, and a green sub-pixel is repetitively arranged adjacent to the particular column. That is, the sub-pixels R, G and B are arranged in a Pentile matrix form.

Red and green sub-pixels R and G or blue and green sub-pixels B and G are arranged in each pixel region 100. In each pixel region 100, the red and green sub-pixels R and G are positioned in a diagonal direction. In this case, the interval between the red and green sub-pixels R and G may be a high-resolution panel. Similarly, the blue and green sub-pixels B and G are also positioned in a diagonal direction. Meanwhile, in some embodiments of the organic light emitting display device, the sub-pixels R, G, B and G positioned in two adjacent pixel regions 100 constitute one pixel to be driven.

In the pixel arrangement structure of some embodiments, the green sub-pixel G may be formed to have a narrower area than the red and blue sub-pixels R and B, in consideration of light emitting efficiency. The blue sub-pixel B may be formed to have a wider area than the red sub-pixel R, in consideration of the light emitting efficiency. The areas of the sub-pixels R, G and B may be changed in consideration of the light emitting efficiency.

Figure 2A:
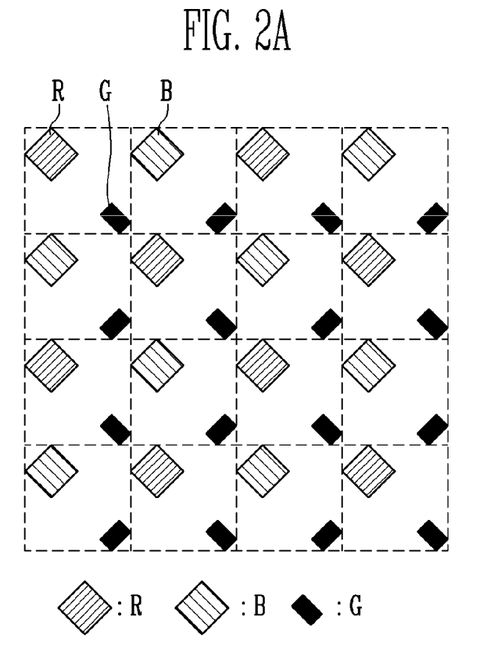
FIGS. 2A to 2D are views illustrating patterns of data corresponding to positions of a panel.
Figure 2B:
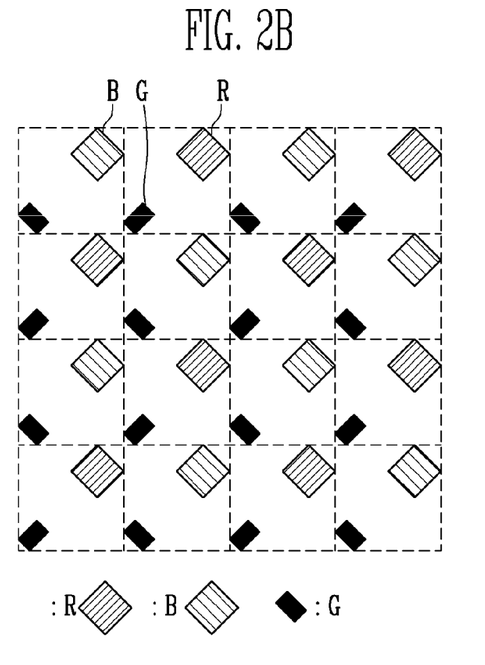
Figure 2C:
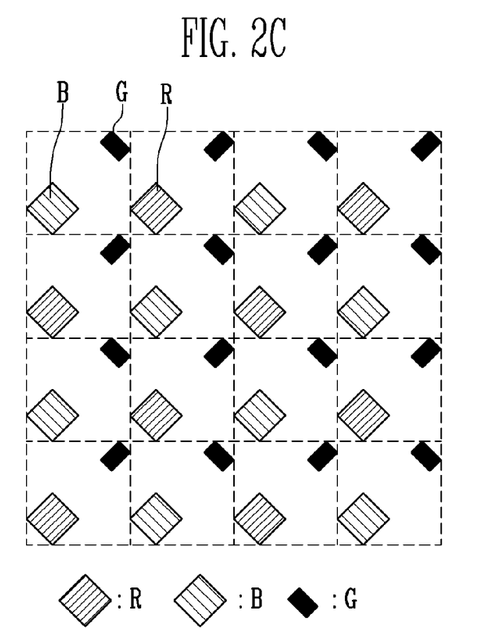
Figure 2D:
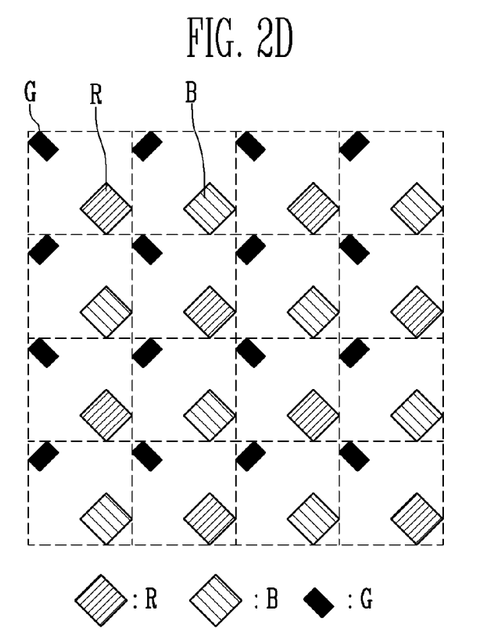

Meanwhile, in a case where a panel having the pixel arrangement structure of some embodiments is used in a portable device, data is changed and supplied depending on a change in position of the panel. For example, in a case where the panel is driven at a normal position, the data is supplied in a first pattern (R, G, B, G, . . . ) as shown in FIG. 2A. In a case where the panel is rotated to the left side at 90 degrees, the data is supplied in a second pattern (G, B, G, R, . . . ) as shown in FIG. 2B. In a case where the panel is rotated to the right side at 90 degrees, the data is supplied in a third pattern (B, G, R, G, . . . ) as shown in FIG. 2C. In a case where the panel is vertically reversed, the data is supplied in a fourth pattern (G, R, G, B, . . . ) as shown in FIG. 2D. However, in the organic light emitting display device of some embodiments in which the sub-pixels are arranged in the Pentile matrix form, there is a problem in that one color is seen at an edge of the panel.

Figure 3A:
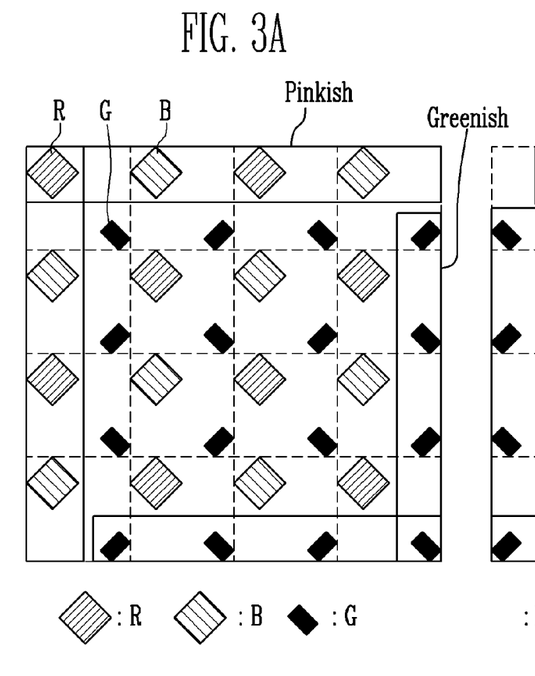
FIGS. 3A to 3D are views illustrating states in which specific colors are recognized in the form of lines, corresponding to positions of the panel.
Figure 3B:
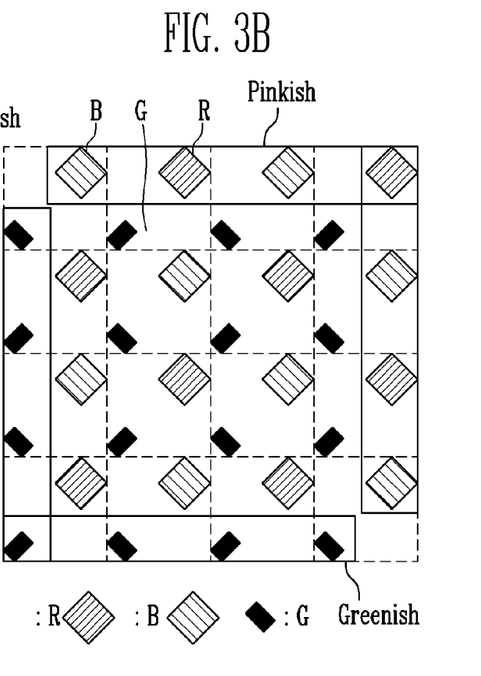
Figure 3C:
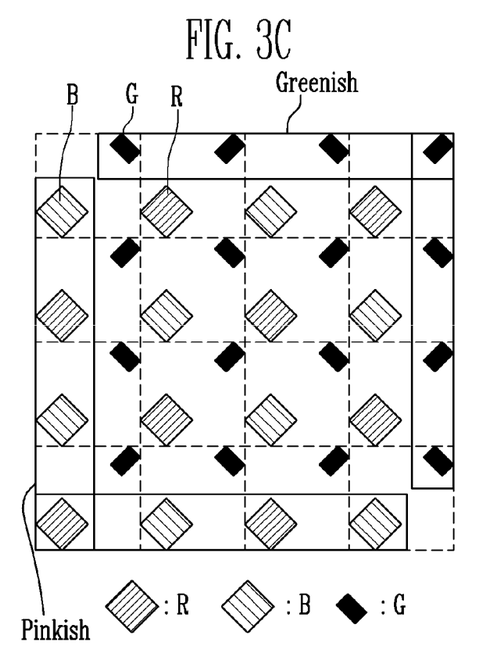
Figure 3D:
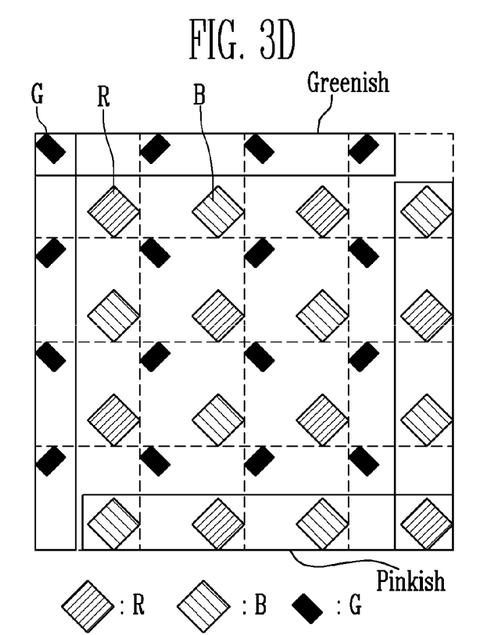

Practically, in a case where the data is input in the first pattern, as shown in FIG. 3A, a pinkish strip may be strongly recognized at upper and left edges, and a greenish stripe is strongly recognized at a right edge. Similarly, in a case where the data is supplied in the second to fourth patterns, pinkish and greenish stripes are strongly recognized at edges as shown in FIGS. 3B to 3D.

To solve such a problem, a dimming process may be performed on data supplied to sub-pixels R, G and B positioned at the edges of the panel. Here, the dimming process refers to a process of reducing the grayscale value of the data supplied to the edges of the panel so as to prevent the color from being strongly recognized along the edges.

Figure 4:
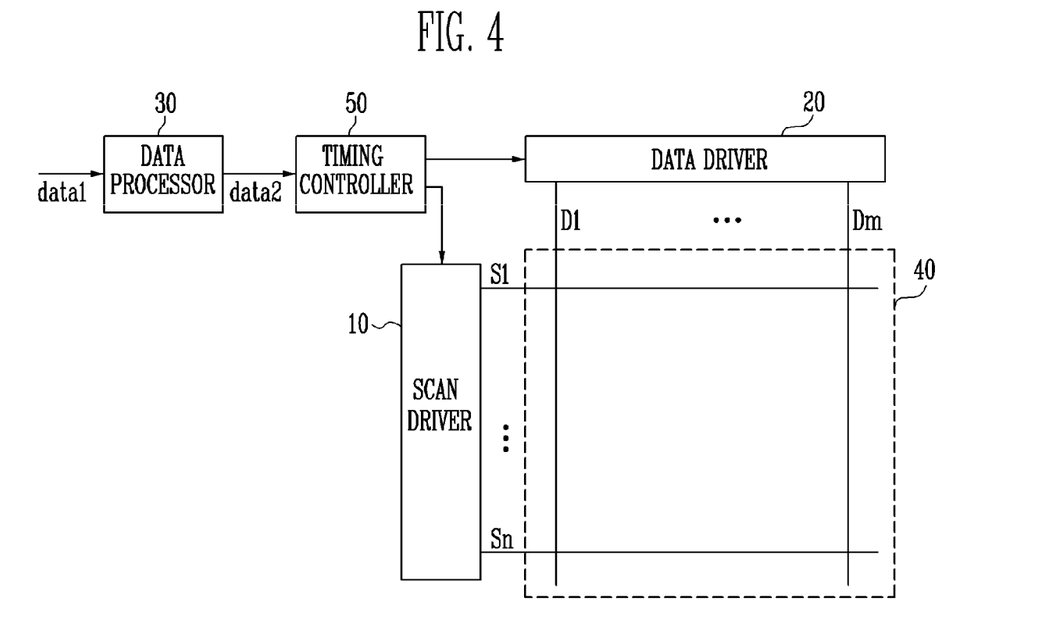
FIG. 4 is a block diagram illustrating an organic light emitting display device according to an embodiment.

FIG. 4 is a block diagram illustrating an organic light emitting display device according to an embodiment. Referring to FIG. 4, the organic light emitting display device according to this embodiment includes a scan driver 10 for driving scan lines S1 to Sn, a data driver 20 for driving data lines D1 to Dm, a timing controller 50 for controlling the scan driver 10 and the data driver 20, and a data processor 30 for generating a second data data2 by performing a dimming process on a first data data1 supplied from the outside thereof.

The sub-pixels R, G and B are arranged into a structure, as shown in FIG. 1, in a pixel unit 40 in which the scan lines S1 to Sn and the data lines D1 to Dm intersect with each other. The scan driver 10 supplies a scan signal to the scan lines S1 to Sn. Here, the scan driver 10 may supply the scan signal in a forward or reverse direction, corresponding to the position of a panel. The data driver 20 generates a data signal using the second data data2, and supplies the generated data signal to the data lines D1 to Dm in synchronization with the scan signal. Then, the data signal is supplied to sub-pixels R, G and B selected by the scan signal. The timing controller 50 supplies a control signal (not shown) for controlling the scan driver 10 and the data driver 20. The timing controller 50 provides, to the data driver 20, the second data data2 supplied from the data processor 30. The data processor 30 generates the second data data2 by detecting a pattern (one of the first to fourth patterns) of data and performing a dimming process on the first data data1, corresponding to the detected pattern. Practically, the data processor 30 generates the second data data2 by reducing the grayscale value of the first data data1 to be supplied outermost sub-pixels of the panel so that a specific color is not recognized at an edge of the panel. The detailed operation of the data processor 30 will be described later.

Figure 5:
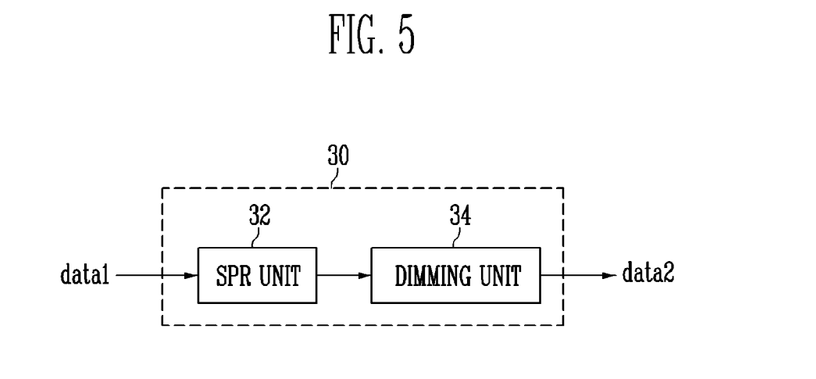
FIG. 5 is a block diagram illustrating a data processor according to an embodiment.

FIG. 5 is a block diagram illustrating the data processor according to an embodiment. Referring to FIG. 5, the data processor 30 according to this embodiment includes a sub-pixel rendering (SPR) unit 32 and a dimming unit 34.

The SPR unit 32 operates according to an algorithm for improving readability of characters, etc. Any one of various algorithms currently known in the art may be applied with the SPR unit 32 in conjunction with a Pentile pixel arrangement. Additionally, the SPR unit 32 may be omitted in some embodiments. The dimming unit 34 generates the second data data2 by controlling the grayscale values of the first data data1 to be supplied sub-pixels positioned at the outermost edges of the panel, corresponding to the pattern of data.

Figure 6:
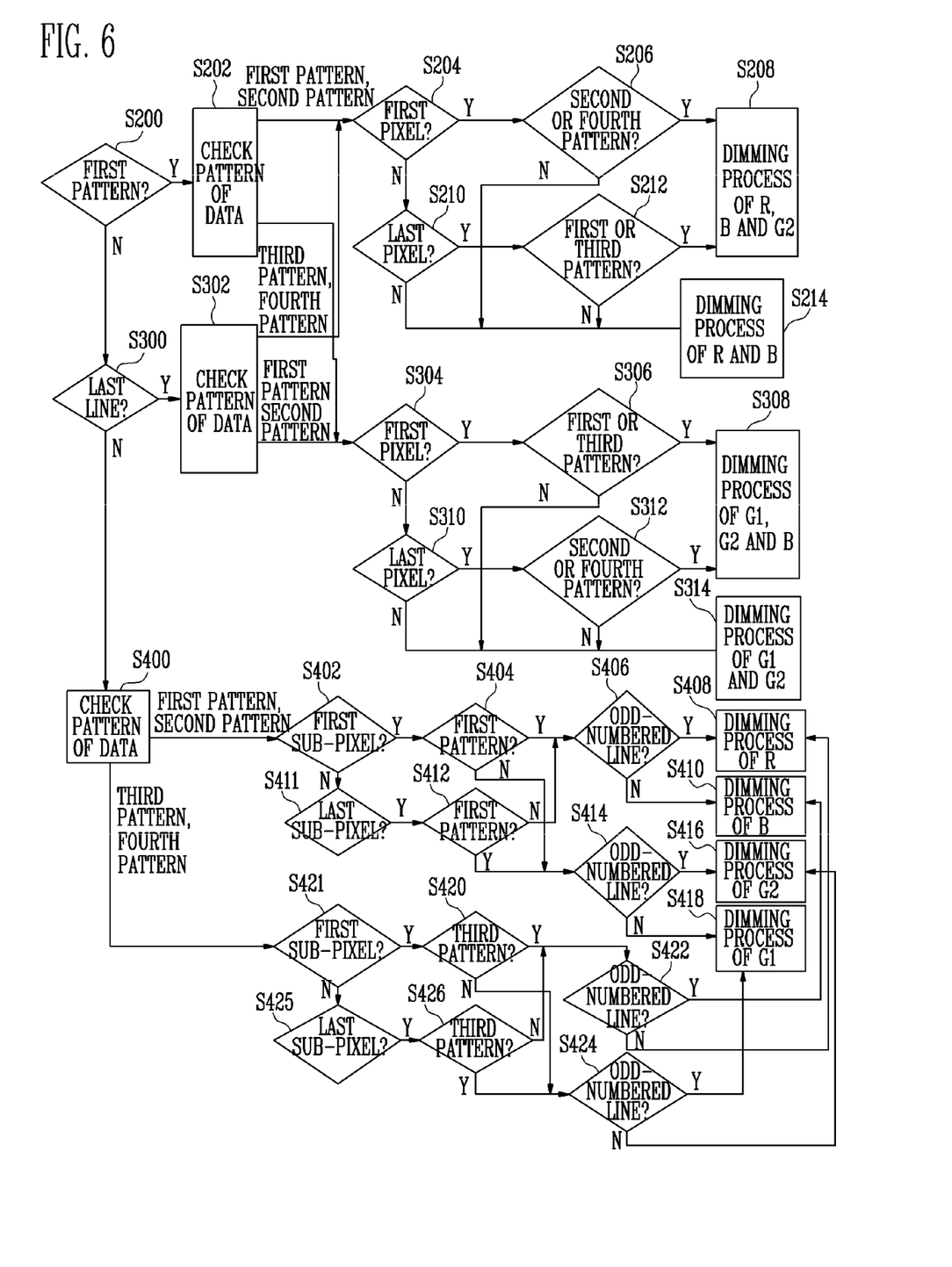
FIG. 6 is a flowchart illustrating an operation of a dimming unit according to an embodiment.

FIG. 6 is a flowchart illustrating a method of operating the dimming unit according to an embodiment. Referring to FIG. 6, the dimming unit 34 checks whether or not the first data data1 input thereto is a data of the first or last line. Practically, as shown FIGS. 3A to 3D, the first data data1 supplied to the first and last lines is generated as the second data data2 by performing a dimming process on the first data data1.

The dimming unit 34 generates the second data data2 by performing a dimming process on the first data data1 to be supplied to the first and last pixels positioned on each of the lines other than the first and last lines. That is, the dimming unit 34 generates the second data data2 by reducing the grayscale values of the first data data1 to be supplied to sub-pixels R, G and B positioned at edges of the panel, and supplies the generated second data data2 to the timing controller 50.

The operation of the dimming unit 34 will be described in further detail. The dimming unit 34 decides whether or not the first data data1 input from the outside thereof is a data to be supplied to the first line (S200). In a case where it is decided in step S200 that the first data data1 is the data to be supplied to the first line, the dimming unit 34 checks a pattern of the data pattern (S202). Here, the pattern of the data is divided into first, second, third and fourth patterns as shown in FIGS. 3A to 3D.

In a case where it is decided in step S202 that the pattern of the data is the first pattern, the dimming unit 34 decides whether or not the first data data1 is supplied to the first pixel of the first line (S204).

In a case where it is decided in step 204 that the first data data1 is supplied to the first pixel, the dimming unit 34 decides whether the pattern of the data is the second or fourth pattern (S206). Here, the pattern of the data has been decided as the first pattern in step S202, and hence the dimming unit 34 generates the second data data2 by performing a dimming process on the first data data1 to be supplied to red and blue sub-pixels R and B (S214) (dimming process of R and B positioned at upper edge/left edge of FIG. 3).

In a case where the first data data1 does not correspond to the first pixel in step S204, the dimming unit 34 decides whether or not the first data data1 is input to the last pixel of the first line (S210). If it is decided in step S210 that the first data data1 is supplied to the last pixel, the dimming unit 34 decides whether the pattern of the data is the first or third pattern (S212). Here, the pattern of the data has been decided as the first pattern in step S202, and hence the dimming unit 34 performs a dimming process on the first data data1 corresponding to red, blue and green sub-pixels R, B and G2 (dimming process of R, B and G positioned at upper edge/right edge of FIG. 3A). Here, that the green sub-pixel is designated by G2 means that the green sub-pixel is positioned in the same pixel region 100 as the blue sub-pixel B. For convenience of illustration, the green sub-pixel positioned in the same pixel region 100 as the red sub-pixel R is designated by G1. Meanwhile, in a case where it is decided in step S210 that the first data data1 is not input to the last pixel, i.e., in a case where the first data data1 is input to one of the pixels positioned between the first and last pixels, the dimming unit 34 performs a dimming process on the first data data1, corresponding to the red and blue sub-pixels R and B (S214). As described above, in a case where the data of the first pattern is input, the dimming unit 34 generates the second data data2 by performing a dimming process on the first data data1 corresponding to sub-pixels positioned at the upper edge while passing through steps S202 to S214.

In a case where it is decided in step S202 that the pattern of the data is the second pattern, the dimming unit 34 decides whether or not the first data data1 is supplied to the first pixel of the first line (S204).

If it is decided in step 204 that the first data data1 is supplied to the first pixel, the dimming unit 34 decides whether the pattern of the data is the second or fourth pattern (S206). Here, the pattern of the data has been decided as the second pattern in step S202, the dimming unit 34 generates the second data data2 by performing a dimming process on the first data data1 when the first data data1 is supplied to the red, blue and green sub-pixels R, B and G2 included in the first pixel (S208) (dimming process of R, B and G positioned at upper edge/left edge of FIG. 3B).

In a case where the first data data1 does not correspond to the first pixel in step S204, the dimming unit 34 decides whether or not the first data data1 is input to the last pixel (S210). In a case where it is decided in step S210 that the first data data1 is supplied to the last pixel, the dimming unit 34 decides whether the pattern of the data is the first or third pattern (S212). Here, the pattern of the data has been decided as the second pattern in step 202, and hence the dimming unit 34 performs a dimming process on the first data data1 corresponding to the red and blue sub-pixels R and B (S214) (dimming process of R and B positioned at upper edge/right edge of FIG. 3B). Meanwhile, in a case where it is not decided in step S210 that the first data data1 is input to the last pixel, i.e., in a case where the first data data1 is input to one of the pixels positioned between the first and last pixels, the dimming unit 34 performs a dimming process on the first data data1 corresponding to the red and blue sub-pixels R and B (S214). As described above, in a case where the data of the second pattern is input, the dimming unit 34 generates the second data data2 by performing a dimming process on the first data data1 corresponding to sub-pixels positioned at the upper edge while passing through steps S202 to S214.

In a case where it is decided in step S202 that the pattern of the data is the third pattern, the dimming unit 34 decides whether or not the first data data1 is supplied to the first pixel (S304).

If it is decided in step S304 that the first data data1 is supplied to the first pixel, the dimming unit 34 decides whether the pattern of the data is the first or third pattern (S306). Here, the pattern of the data has been decided as the third pattern in step S202, and hence the dimming unit 34 generates the second data data2 by performing a dimming process on the first data data1 to be supplied to the green sub-pixels G1 and G2 and the blue sub-pixel B, which are included in the first pixel (S308) (dimming process of B, G and G positioned at upper edge/left edge of FIG. 3C).

In a case where the first data data1 does not correspond to the first pixel in step S304, the dimming unit 34 decides whether or not the first data data1 is input to the last pixel of the first line (S310). If it is decided in step S310 that the first data data1 is supplied to the last pixel, the dimming unit 34 decides whether the pattern of the data is the second or fourth pattern (S312). Here, the pattern of the data has been decided as the third pattern in step S202, and hence the dimming unit 34 performs a dimming process of the first data data1 corresponding to the green sub-pixels G1 and G2 (S314) (dimming process of G and G positioned at upper edge/right edge of FIG. 3C). Meanwhile, in a case where it is not decided in step S310 that the first data data1 is input to the last pixel, i.e., in a case where the first data data1 is input to one of the pixels between the first and last pixels, the dimming unit 34 performs a dimming process corresponding the green sub-pixels G1 and G2 (S314). As described above, in a case where the data of the third pattern is input, the dimming unit 34 generates the second data data2 by performing a dimming process on the first data data1 corresponding to the sub-pixels positioned at the upper edge while passing through step S202, and S304 to S314.

In a case where it is decided in step S202 that the pattern of the data is the fourth pattern, the dimming unit 34 decides whether or not the first data data1 is supplied to the first pixel (S304).

If it is decided in step S304 that the first data data1 is supplied to the first pixel, the dimming unit 34 decides whether the pattern of the data is the first or third pattern (S306). Here, the pattern of the data has been decided as the fourth pattern in step S202, and hence the dimming unit 34 generates the second data data2 by performing a dimming process on the first data data1 to be supplied to the green sub-pixels G1 and G2 included in the first pixel (S314) (dimming process of G and G positioned at upper edge/left edge of FIG. 3D).

In a case where the first data data1 does not correspond to the first pixel in step S304, the dimming unit 34 decides whether or not the first data data1 is input to the last pixel (S310). If it is decided in step S310 that the first data data1 is supplied to the last pixel, the dimming unit 34 decides whether the pattern of the data is the second or fourth pattern (S312). Here, the pattern of the data has been decided as the fourth pattern in step S202, and hence the dimming unit 34 generates the second data data2 by performing a dimming process on the first data data1 to be supplied to the green sub-pixels G1 and G2 and the blue sub-pixel B, which are included in the last pixel (S308) (dimming process of G, G and B positioned at upper edge/right edge of FIG. 3D). Meanwhile, in a case where it is not decided in step S310 that the first data data1 is input to the last pixel, i.e., in a case where the first data data1 is input to one of the pixels between the first and last pixels, the dimming unit 34 generates the second data data2 by performing a dimming process on the first data data1 corresponding to the sub-pixels positioned at the upper edge while passing through steps S202 and S304 to S314.

Meanwhile, it is not decided in step S200 that the first data data1 is the data to be supplied to the first line, the dimming unit 34 decides whether or not the first data data1 is a data to be supplied to the last line (S300). In a case where it is decided in step S300 that the first data data1 is the data to be supplied to the last line, the dimming unit 34 checks a pattern of the data (S302).

In a case where it is decided in step S302 that the pattern of the data is the first pattern, the dimming unit 34 decides whether the first data data1 is supplied to the first or last pixel of the last line (S304 and S310). In a case where it is decided in step S304 that the first data data1 is supplied to the first pixel, the dimming unit 34 decides whether the pattern of the data is the first or third pattern (S306). Here, the pattern of the data has been decided as the first pattern in step S302, and hence the dimming unit 34 generates the second data data2 by performing a dimming process on the first data data1 to be supplied to the green pixels G1 and G2 and the blue pixel B, which are included in the first pixel (S308) (dimming process of B, G and G positioned at lower edge/left edge of FIG. 3A).

In a case where it is decided in step S310 that the first data data1 is supplied to the last pixel, the dimming unit 34 decides whether the pattern of the data is the second or fourth pattern (S312). Here, the pattern of the data has been decided as the first pattern in step S302, the dimming unit 34 generated the second data data2 by performing a dimming process on the first data data1 to be supplied to the green sub-pixels G1 and G2 included in the last pixel (S314) (dimming process of G and G positioned at lower edge/right edge of FIG. 3A). Meanwhile, it is not decided in step S310 that the first data data1 is not input to the last pixel, i.e., in a case where the first data data1 is input to one of the pixels between the first and last pixels, the dimming unit 34 performs a dimming process of the first data data1 corresponding to the green sub-pixels G1 and G2 (S314). As described above, in a case where the data of the first pattern is input, the dimming unit 34 generates the second data data2 by performing a dimming process on the first data data1 corresponding to sub-pixels positioned at a lower edge while passing through steps S302 to S314.

In a case where it is decided in step S302 that the pattern of the data is the second pattern, the dimming unit 34 decides whether the first data data1 is supplied to the first or last pixel (S304 and S310). In a case where it is decided in step 304 that the first data data1 is supplied to the first pixel, the dimming unit 34 decides whether the pattern of the data is the first or third pattern (S306). Here, the pattern of the data has been decided as the second pattern in step S302, and hence the dimming unit 34 generates the second data data2 by performing a dimming process on the first data data1 to be supplied to the green sub-pixels G1 and G2 included in the first pixel (S314) (dimming process of G and G positioned at lower edge/left edge of FIG. 3B).

In a case where it is decided in step S310 that the first data data1 is supplied to the last pixel, the dimming unit 34 decides whether the pattern of the data is the second or fourth pattern (S312). Here, the pattern of the data has been decided as the second pattern in step S302, and hence the dimming unit 34 generates the second data data2 by performing a dimming process on the first data data1 to be supplied to the green sub-pixels G1 and G2 and the blue sub-pixel B, which are included in the last pixel (S308) (dimming process of G, G and B positioned at lower edge/right edge of FIG. 3B). Meanwhile, in a case where it is not decided in step S310 that the first data data1 is input to the last pixel, i.e., in a case where the first data data1 is input to one of the pixels between the first and last pixels, the dimming unit 34 performs a dimming process on the first data data1 corresponding to the green sub-pixels G1 and G2 (S314). As described above, in a case where the data of the second pattern is input, the dimming unit 34 generates the second data data2 by performing a dimming process on the first data data1 corresponding to the sub-pixels positioned at the lower edge while passing through steps S302 to S314.

In a case where it is decided in step S302 that the pattern of the data is the third pattern, the dimming unit 34 decides whether the first data data1 is supplied to the first or last pixel (S204 and S210). In a case where it is decided at step S204 that the first data data1 is supplied to the first pixel, the dimming unit 34 decides whether the pattern of the data is the second or fourth pattern (S206). Here, the pattern of the data has been decided as the third pattern in step S302, and hence the dimming unit 34 generates the second data data2 by performing a dimming process on the first data data1 to be supplied to the red and blue sub-pixels R and B included in the first pixel (S214) (dimming process of R and B positioned at lower edge/left edge of FIG. 3C).

In a case where it is decided in step S210 that the first data data1 is supplied to the last pixel, the dimming unit 34 decides whether the pattern of the data is the first or third pattern (S212). Here, the pattern of the data has been decided as the third pattern in step S302, and hence the dimming unit 34 generates the second data data2 by performing a dimming process on the first data data1 to be supplied to the red, blue and green sub-pixels R, B and G included in the last pixel (S208) (dimming process of R, B and G positioned at lower edge/right edge of FIG. 3C). Meanwhile, in a case where it is not decided in step S210 that the first data data1 is input to the last pixel, i.e., in a case where the first data data1 is input to one of the pixels between the first and last pixels, the dimming unit 34 performs a dimming process on the first data data1 corresponding to the red and blue sub-pixels R and B (S214). As described above, in a case where the data of the third pattern is input, the dimming unit 34 generates the second data data2 by performing a dimming process on the first data data1 corresponding to the sub-pixels positioned at the lower edge while passing through steps S302 and S204 to S214.

In a case where it is decided in step S302 that the pattern of the data is the fourth pattern, the dimming unit 34 decides whether the first data data1 is supplied to the first or last pixel (S204 and S210). In a case where it is decided in step S204 that the first data data1 is supplied to the first pixel, the dimming unit 34 decides whether the pattern of the data is the second or fourth pattern (S206). Here, the pattern of the data has been decided as the fourth pattern in step S302, and hence the dimming unit 34 generates the second data data2 by performing a dimming process on the first data data1 to be supplied to the red, blue and green sub-pixels R, B and G2 included in the first pixel (S208) (dimming process of G, B and R positioned at lower edge/left edge of FIG. 3D).

In a case where it is decided in step S210 that the first data data1 is supplied to the last pixel, the dimming unit 34 decides whether the pattern of the data is the first or third pattern (S212). Here, the pattern of the data has been decided as the fourth pattern in step S302, and hence the dimming unit 34 generates the second data data2 by performing a dimming process on the first data data1 to be supplied to the red and blue sub-pixels R and B included in the last pixel (S214) (dimming process of R and B positioned at lower edge/right edge) of FIG. 3D). Meanwhile, in a case where it is not decided in step S210 that the first data data1 is input to the last pixel, i.e., in a case where the first data data1 is input to one of the pixels between the first and last pixels, the dimming unit 34 performs a dimming process on the first data data1 corresponding to the red and blue sub-pixels R and B (S214). As described above, in a case where the data of the fourth pattern is input, the dimming unit 34 generates the second data data2 by performing a dimming process on the first data data1 corresponding to the sub-pixels positioned at the lower edge while passing through steps S302 and S204 to S214.

Meanwhile, in a case where it is not decided in step S300 that the first data data1 is the data to be supplied to the last line, i.e., in a case where the first data data1 is a data to be supplied to one of the lines between the first and last lines, the dimming unit 34 checks a pattern of the data (S400).

In a case where it is decided in step S400 that the pattern of the data is the first or second pattern, the dimming unit 34 decides whether or not the first data data1 is supplied to the first or last sub-pixel (S402 and S411).

In a case where it is decided in step S402 that the first data data1 is a data corresponding to the first sub-pixel, the dimming unit 34 decides whether or not the pattern of the data is the first pattern (S404). In a case where it is decided in step S404 that the pattern of the data is the first pattern, the dimming unit 34 decides whether or not the first data data1 is supplied to an odd-numbered line (S406). In a case where it is decided in step S406 that the first data data1 is supplied to the odd-numbered line, the dimming unit 34 performing a dimming process on the first data data1 by deciding that the first data data1 is a data to be supplied to the red sub-pixel R (S408). In a case where it is decide in step S406 that the first data data1 is not supplied to the odd-numbered line, the dimming unit 34 performs a dimming process on the first data data1 by deciding that the first data data1 is a data to be supplied to the blue sub-pixel B (S410).

In a case where it is not decided in step S404 that the pattern of the data is the first pattern, the dimming unit 34 decides whether or not the first data data1 is supplied to the odd-numbered line (S414). In a case where it is decided in step S414 that the first data data1 is supplied to the odd-numbered line, the dimming unit 34 performs a dimming process on the first data data1 by deciding that the first data data1 is a data to be supplied to the green sub-pixel G2 (S416). In a case where it is decided in step S414 that the first data data1 is not supplied to the odd-numbered line, the dimming unit 34 performs a dimming process on the first data data1 by deciding that the first data data1 is the data to be supplied to the green sub-pixel G1 (S418).

In a case where it is decided in step S411 that the first data data1 is a data corresponding to the last sub-pixel, the dimming unit 34 whether or not the pattern of the data is the first pattern (S412). In a case where it is decided in step S412 that the pattern of the data is the first pattern, the dimming unit 34 decides whether or not the first data data1 is supplied to the odd-numbered line (S414). In a case where it is decided in step S414 that the first data data1 is supplied to the odd-numbered line, the dimming unit 34 performs a dimming process on the first data data1 by deciding that the first data data1 is the data to be supplied to the green sub-pixel G2 (S416). In a case where it is decided in step S414 that the first data data1 is not supplied to the odd-numbered line, the dimming unit 34 performs a dimming process on the first data data1 by deciding that the first data data1 is the data to be supplied to the green sub-pixel G1 (S418).

In a case where it is not decided in step S412 that the pattern of the data is the first pattern, the dimming unit 34 decides whether or not the first data data1 is supplied to the odd-numbered line (S406). In a case where it is decided in step S406 that the first data data1 is supplied to the odd-numbered line, the dimming unit 34 performs a dimming process on the first data data1 by deciding that the first data data1 is a data to be supplied to the red sub-pixel R (S408). In a case where it is decided in step S406 that the first data data1 is not supplied to the odd-numbered line, the dimming unit 34 performs a dimming process on the first data data1 by deciding that the first data data1 is a data to be supplied to the blue sub-pixel B (S410).

Practically, in a case where the data of the first or second pattern is input, the dimming unit 34 performs a dimming process on the first data data1 to be supplied to the sub-pixels positioned at edges of the other lines except the first and last lines, i.e., the first and last sub-pixels, using steps S400 to S418.

In a case where it is decided in step S400 that the pattern of the data is the third or fourth pattern, the dimming unit 34 decides whether the first data data1 is supplied to the first or last sub-pixel (S421 and S425).

In a case where it is decided in step S421 that the first data data1 is a data corresponding to the first sub-pixel, the dimming unit 34 decides whether or not the pattern of the data is the third pattern (S420). In a case where it is decided in step S420 that the pattern of the data is the third pattern, the dimming unit 34 decides whether or not the first data data1 is supplied to the odd-numbered line (S422). In a case where it is decided in step S422 that the first data data1 is supplied to the odd-numbered line, the dimming unit 34 performs a dimming process of the first data data1 by deciding that the first data data1 is a data to be supplied to the blue sub-pixel B (S410). In a case where it is decided in step S422 that the first data data1 is not supplied to the odd-numbered line, the dimming unit 34 performs a dimming process on the first data data1 by deciding that the first data data1 is a data to be supplied to the red sub-pixel R (S408).

In a case where it is not decided in step S420 that the pattern of the data is the third pattern, the dimming unit 34 decides whether or not the first data data1 is supplied to the odd-numbered line (S424). In a case where it is decided in step S424 that the first data data1 is supplied to the odd-numbered line, the dimming unit 34 performs a dimming process of the first data data1 by deciding that the first data data1 is a data to be supplied to the green sub-pixel G1 (S418). In a case where it is decided in step S424 that the first data data1 is not supplied to the odd-numbered line, the dimming unit 34 performs a dimming process on the first data data1 by deciding that the first data data1 is a data to be supplied to the green sub-pixel G2 (S416).

In a case where it is decided in step S425 that the first data data1 is a data corresponding to the last sub-pixel, the dimming unit 34 decides whether or not the pattern of the data is the third pattern (S426). In a case where it is decided in step S426 that the pattern of the data is the third pattern, the dimming unit 34 decides whether or not the first data data1 is supplied to the odd-numbered line (S424). In a case where it is decided in step S424 that the first data data1 is supplied to the odd-numbered line, the dimming unit 34 performs a dimming process of the first data data1 by deciding that the first data data1 is the data to be supplied to the green sub-pixel G1 (S418). In a case where it is decided in step S424 that the first data data1 is not supplied to the odd-numbered line, the dimming unit 34 performs a dimming process on the first data data1 by deciding that the first data data1 is the data to be supplied to the green sub-pixel G2 (S416).

In a case where it is not decided in step S426 that the pattern of the data is the third pattern, the dimming unit 34 decides whether or not the first data data1 is supplied to the odd-numbered line (S422). In a case where it is decided in step S422 that the first data data1 is supplied to the odd-numbered line, the dimming unit 34 performs a dimming process on the first data data1 by deciding that the first data data1 is a data to be supplied to the blue sub-pixel B (S410). In a case where it is decided in step S422 that the first data data1 is not supplied to the odd-numbered line, the dimming unit 34 performs a dimming process on the first data data1 by deciding that the first data data1 is a data to be supplied to the red sub-pixel R (S408).

Practically, in a case where the data of the third or fourth pattern is input, the dimming unit 34 performs a dimming process while repetitively performing the aforementioned procedure on the sub-pixels positioned at the edges of the other lines except the first and last lines, i.e., the first and last sub-pixels.

As described above, the dimming unit 34 performs a dimming process on data to be supplied to the sub-pixels positioned at the edges of the panel corresponding to the first, second, third and fourth patterns of the data while being driven as shown in FIG. 6. Here, a dimming value corresponding to each of the sub-pixels R, B, G1 and G2 is experimentally determined in consideration of the resolution, inch and light emitting efficiency of the panel. For example, the dimming unit 34 may generate the second data data2 by performing a dimming process on the first data data1 so that the luminance of the sub-pixels is lowered by a factor of ½, corresponding to the red and blue sub-pixels R and B. The dimming unit 34 may generate the second data data2 by performing a dimming process on the first data data1 so that the luminance of the green sub-pixel G1 is lowered by a factor of ⅗ and the luminance of the green sub-pixel G2 is lowered to 4/7.

That is, the dimming unit 34 can detect the red sub-pixel R, the blue sub-pixel B and the green sub-pixels G1 and G2, which are positioned at the edges of the panel, while being driven as shown in FIG. 5. Accordingly, various dimming processes are possible.

While the various features and aspects have been described in connection with certain exemplary embodiments, it is to be understood that the invention is not limited to the disclosed embodiments, but, on the contrary, is intended to cover various modifications and equivalent arrangements.

What is claimed is:

1. A display device, comprising:
a display panel comprising:
a plurality of first color sub-pixels and a plurality of second color sub-pixels arranged in odd-numbered rows and columns, wherein one of the first color sub-pixels and one of the second color sub-pixels are alternately arranged in each of the odd-numbered rows or columns; and
a plurality of third color sub-pixels arranged only in even-numbered rows and columns;
a scan driver configured to drive scan lines coupled to the first, second and third color sub-pixels;
a data processor configured to receive first data and to generate second data based on the first data, wherein the data processor is configured to generate the second data by changing grayscale values of the first data for the first, second, or third color sub-pixels positioned in the odd-numbered or even-numbered rows or columns nearest to an edge of the display panel; and
a data driver configured to drive data lines coupled to the first, second, and third color sub-pixels and extended in a direction crossing the scan lines, wherein the data lines are driven by the first or second data.

2. The display device according to claim 1, wherein:
the data processor comprises a dimming unit configured to generate the second data; and
the dimming unit is configured to decide whether the first data is data for a first line, a last line or other lines of the display panel.

3. The display device according to claim 2, wherein the dimming unit is configured to generate the second data by reducing the grayscale values of the first data.

4. The display device according to claim 3, wherein the dimming unit is configured to generate the second data by reducing the grayscale values of the first data corresponding to sub-pixels on the first and last lines and first and last sub-pixels on the other lines.

5. The display device according to claim 2, wherein the dimming unit is configured to generate the second data by changing the grayscale values of the first data corresponding to selected sub-pixels positioned in each column of the display panel based on a decision of the dimming unit.

6. The display device of claim 1, wherein a size of one of the third color sub-pixels is smaller than a size of one of the first or second color sub-pixels.

7. The display device of claim 6, wherein the first color sub-pixels are configured to emit red light, the second color sub-pixels are configured to emit blue light, and the third color sub-pixels are configured to emit green light.

8. The display device of claim 1, wherein the display panel is configured to operate in a plurality of positions, each of the positions having a sub-pixel color pattern based on an arrangement of the first, second and third color sub-pixels.

9. The display device of claim 8, wherein the first data is supplied according to the sub-pixel color pattern corresponding to each position.

10. The display device of claim 9, wherein the data processor is configured to detect a pattern of the first data and to perform a dimming process on the first data based on a detected pattern of the first data.

11. The display device of claim 1, wherein each of the third color sub-pixels is at a diagonal direction with respect to one of the first or second color sub-pixels.

12. The display device of claim 1, wherein each of the odd-numbered rows and columns comprises at least one of the first color sub-pixels and at least one of the second color sub-pixels and none of the third color sub-pixels.

* * * * *